(12) United States Patent
Wang et al.

(10) Patent No.: US 8,228,604 B2
(45) Date of Patent: Jul. 24, 2012

(54) ELECTROMAGNETIC (EM) WAVE POLARIZING STRUCTURE AND METHOD FOR PROVIDING POLARIZED ELECTROMAGNETIC (EM) WAVE

(75) Inventors: Jih-Fu Trevor Wang, Changhua County (TW); Jim-Yong Chi, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 410 days.

(21) Appl. No.: 12/497,861

(22) Filed: Jul. 6, 2009

(65) Prior Publication Data
US 2009/0268291 A1    Oct. 29, 2009

Related U.S. Application Data

(63) Continuation-in-part of application No. 11/439,478, filed on May 22, 2006, now abandoned.

(30) Foreign Application Priority Data

Nov. 14, 2005    (TW) ................................ 94139860 A

(51) Int. Cl.
     *G02B 5/30*      (2006.01)
(52) U.S. Cl. ........................ 359/489.01; 359/489.06
(58) Field of Classification Search .................... None
See application file for complete search history.

(56) References Cited

U.S. PATENT DOCUMENTS 7,462,873 B2 *   12/2008   Hoshi et al. ...................... 257/88
2004/0184129 A1 *   9/2004   Solli ............................. 359/222

OTHER PUBLICATIONS

K. Inoue, M. Wada, K. Sakoda, A. Yamanaka, M. Hayashi, J. W. Haus, 'Fabrication of two-dimensional photonic band structure with near-infrared band gap', Jpn. J. Appl. Phys., vol. 33, No. 10B, Oct. 15, 1994, pp. L1463-L1465.*

* cited by examiner

*Primary Examiner* — Arnel C Lavarias
(74) *Attorney, Agent, or Firm* — J.C. Patents

(57) ABSTRACT

The EM polarizing structure contains a two dimensional planar variation structure, having medium nodes regularly distributed as a two dimensional planar photonic unit lattice cell array on a plane. Each of the photonic unit lattice cells has an operation axis and is identical at each lattice point, which passes a diagonal of photonic unit lattice cell. The medium nodes within each planar photonic unit lattice cell are distributed asymmetrical with respect to the operation axis direction and identical at each lattice point. The EM polarizing structure is used to modulate an input EM wave around an operation frequency of the photonic band associated with the EM wave polarizing structure. Thus a corresponding output EM wave becomes polarized. Moreover, the EM wave polarizing structure can be integrated with an EM wave emitting source. Thus an output EM wave from the device is polarized.

17 Claims, 18 Drawing Sheets

US 8,228,604 B2

ELECTROMAGNETIC (EM) WAVE POLARIZING STRUCTURE AND METHOD FOR PROVIDING POLARIZED ELECTROMAGNETIC (EM) WAVE

CROSS-REFERENCE TO RELATED APPLICATION

This is a continuation-in-part application of and claims the priority benefit of patent application Ser. No. 11/439,478, filed on May 22, 2006, which claims the priority benefit of Taiwan application serial no. 94139860, filed on Nov. 14, 2005. The entirety of each of the above-mentioned patent applications is hereby incorporated by reference herein and made a part of this specification.

BACKGROUND OF THE INVENTION

1. Field of Invention

The invention relates to an electromagnetic (EM) wave polarizing technique, more particularly, to an asymmetric two-dimensional photonic crystal unit cell array structure and method for generating a non-in-plane polarized EM wave.

2. Description of Related Art

Generally, most of electromagnetic (EM) waves in nature exist in a non-polarized state. Herein, light refers to an EM wave at around a frequency within a specific range. Since the electric field direction of a non-polarized EM wave is not unique in any direction while propagating in space, a non-polarized EM wave is not suitable for (or limited to) certain applications. For example, laser systems, display devices, or optical telecommunications systems and the like all require polarized light, and therefore, a polarizer (a device) to polarize an EM wave will be indispensable for many applications. There are a variety of ways to design a polarizer, and a grating-type or polymer-type polarizer is most commonly in use. However, with the advent of semiconductor techniques, there are other new ways to design a polarizer or to polarize an EM wave.

Nowadays, semiconductor opto-electronic devices, such as light emitting diode (LEDs) and vertical cavity surface-emitting lasers (VCSELs), are widely used as light sources. The brief description below is made with respect to LEDs and VCSELs. FIG. 1 is a schematic cross sectional view of a conventional LED structure. In FIG. 1, a conventional LED includes a transparent substrate 100, a bottom clad layer 102, an active layer 104, and a top clad layer 106, which are formed sequentially on the electrode layer 100. In addition, an electrode layer 108 is formed on the top clad layer 106, and supporting layer 110 is formed below the electrode layer 100. FIG. 1 shows the basic structure of a semiconductor LED, and the detailed structure should be understandable by those ordinary skilled in the art, and will not be described any more.

FIG. 2 shows light emitting mechanism of a LED. When an operation voltage is applied to the top and bottom electrode layers 108, 100, holes 114 and electrons 116 will be driven by an electric field to move toward the active layer 104. The potential distribution of the holes 114 is shown as a potential line 111, and that of the electrons 116 is shown as a potential line 112. When the holes 114 and the electrons 116 recombine and annihilate in the active layer 104, light 118 thus emits according to the energy thereof. This emitted light is generally non-polarized or partially polarized.

FIG. 1 is a simplified schematic view of a conventional LED or a surface-emitting laser, which is used as a light source, but without any polarizing effect. In practical applications, in order to obtain a polarized light, a polarizer is required to convert a non-polarized light into a polarized one. With the advent of semiconductor fabrication techniques and electromagnetic wave theory, it's possible that the structure used to polarize light can be incorporated and integrated within a light emitting device such as LED directly. However, the structure used to polarize light can be achieved only after good design, and many manufacturers now continue to develop more efficient, lower cost, and easily-fabricated EM wave polarizing structure.

Conventionally, a polarized EM wave is produced by polarizing a non-polarized (or a partially polarized) EM wave (or light) through a polarizer, or by the means of combining a polarizer and a light emitting device (LED). The disadvantages of these methods are stated as follows. 1. The conventional polarizer reduces light intensity by more than a half while light propagates through it; 2. As for LED combined with a polarizer, the medium interfaces will cause multiple Fresnel reflection loss; 3. The design and fabrication process of a conventional polarizer are excessively complex and expensive.

SUMMARY OF THE INVENTION

In one aspect of the invention, a method for polarizing EM wave includes providing an EM polarizing structure. The EM polarizing structure includes a plurality of photonic unit cells regularly distributed one a plane. Each of the photonic unit cells has a plurality of medium nodes and an operation axis direction passes a diagonal of the medium nodes within each said photonic unit cell. The medium nodes within each said photonic unit cell are distributed asymmetrically with respect to the operation axis direction and identical at each lattice point. The EM polarizing structure is used for processing a non-in-plane input EM wave at around an operation frequency at $\Gamma$ point of the photonic unit cells. An output EM wave is obtained with a polarized state.

In one aspect of the invention, a method for polarizing EM wave includes providing an EM polarizing structure. The said lattice point referred to is each vertex point of said photonic unit cell.

In one aspect of the invention, a method for providing polarized electromagnetic wave, comprising generating an EM wave at around a frequency. An EM polarizing structure is provided. The EM polarizing structure includes a plurality of photonic unit cells distributed in a plane. Each of the photonic unit cells has a plurality of medium nodes and an operation axis passes a diagonal of the medium nodes, and the medium nodes are distributed asymmetrically with respect to the operation axis direction. The photonic unit cells have a crystal structure with $\Gamma$ point, which is near the operation frequency of the EM wave in corresponding to a polarization state. The non-in-plane incident EM wave is processed by the non-in-plane EM polarizing structure and a polarized EM wave is output.

In one aspect of the invention, a method for providing polarized electromagnetic wave includes providing an EM polarizing structure. The EM polarizing structure includes a plurality of photonic unit cells distributed in a plane. Each of the photonic unit cells has a plurality of medium nodes and an operation axis passes a diagonal of the medium nodes, and the medium nodes are distributed asymmetrically with respect to said operation axis direction. The photonic unit cells have a photonic crystal band structure with $\Gamma$ point, wherein a plurality of frequency bands at the $\Gamma$ point are sufficiently separated, each of the frequency bands has a polarization state. A non-in-plane EM wave is generated at a frequency corresponding to one of the frequency bands at the $\Gamma$ point. The non-in-plane EM wave is processed by the EM polarizing structure and outputting a polarized EM wave.

In one aspect of the invention, the said two-dimensional planar variation structure contains a two-dimensional continuously replicated planar pattern structure or a two dimensional periodic planar variation structure.

In one aspect of the invention, a device for polarizing an EM wave of the invention comprises: a foresaid electromagnetic (EM) wave polarizing structure and an EM wave emitting source structure associated with said EM polarizing structure, capable of emitting an EM wave thereof.

Furthermore, in one aspect of the invention, the term Γ point mentioned in current invention is used for a certain two-dimensional photonic unit lattice cell type but, for example, not for honey comb photonic crystal or other complex photonic crystals. The Γ point of said photonic band structure is merely referred to a certain operation point with certain higher symmetric spatial characteristics. A photonic (or A photonic crystal) unit lattice cell here referred to is also defined as a unit lattice cell. In fact a two-dimensional planar variation structure mentioned above is merely "a two dimensional photonic crystal structure".

In one aspect of the invention, an EM wave polarizing structure, which contains a two dimensional periodic planar variation structure, comprising a plurality of two-dimensional photonic unit lattice cells having medium nodes regularly distributed on a plane. Each of said photonic unit lattice cells is identical and has an operation axis, of which direction passes a diagonal of said photonic unit lattice cell. The medium nodes within said photonic unit lattice cell are distributed asymmetrical with respect to said operation axis direction and identical at each lattice point, wherein each photonic unit lattice cell of said array is an in-equilateral parallelogram.

In one aspect of the invention, an EM wave polarizing structure, which contains a two dimensional continuous replicated planar pattern variation structure, comprising a plurality of two-dimensional photonic unit lattice cells having medium nodes regularly distributed on a plane. Each of said photonic unit lattice cells is identical and has an operation axis, of which direction passes a diagonal of said photonic unit lattice cell. The medium nodes within said photonic unit lattice cell are distributed asymmetrical with respect to said operation axis and identical at each lattice point, wherein each photonic unit lattice cell of said array is an in-equilateral parallelogram.

In one aspect of the invention, an EM wave polarizing structure, which contains a two dimensional periodic planar variation structure, comprising a plurality of two-dimensional photonic unit lattice cells having medium nodes regularly distributed on a plane. Each of said photonic unit lattice cells is identical and has an operation axis, of which direction passes a diagonal of said photonic unit lattice cell. The said medium nodes within said photonic unit lattice cell are identical at each lattice point distributed asymmetrical with respect to said operation axis direction. The said EM polarizing structure is used for processing a non-in-plane input EM wave around an operation frequency at Γ point of the photonic band associated with said photonic unit cells. An output EM wave from said EM polarizing structure is thus in a polarized state.

In one aspect of the invention, an EM wave polarizing structure, which contains a two dimensional continuous replicated planar pattern variation structure, comprising a plurality of two-dimensional photonic unit lattice cells having medium nodes regularly distributed on a plane. Each of said photonic unit lattice cells has an operation axis, which passes a diagonal of said photonic unit lattice cell. The said medium nodes within said photonic unit lattice cell are distributed asymmetrical with respect to said operation axis direction and identical at each lattice point. The said EM polarizing structure is used for processing a non-in-plane input EM wave around an operation frequency at Γ point of the photonic band associated with said photonic unit cells. An output EM wave from said EM polarizing structure is thus in a polarized state.

In one aspect of the invention, a means to polarize EM wave comprises: providing a foresaid EM wave polarizing structure; and a non-in-plane EM wave is providing to input foresaid EM wave polarizing structure, wherein foresaid EM wave polarizing structure is used for processing said non-in-plane input EM wave around an operation frequency at Γ point of the photonic band associated with said photonic unit cells of said EM wave polarizing structure. An output EM wave from said EM polarizing structure is thus in a polarized state.

In one aspect of the invention, a means for providing a polarized electromagnetic wave comprising: an EM wave source structure generating a non-in-plane EM input wave around an operation frequency of said EM polarizing structure; a foresaid EM wave polarizing structure is provided, wherein said photonic unit lattice cell array one a plane have a photonic band around an operation frequency at Γ point of said EM wave polarizing structure, which is near a frequency of an output EM wave corresponding to a polarization state. The said input EM wave is processed by said EM wave polarizing structure according to said photonic band around said operation frequency and an output EM wave is thus polarized.

In one aspect of the invention, a means for providing a polarized electromagnetic wave comprising: providing a foresaid EM polarizing structure; and a non-in-plane EM input wave around an operation frequency. The said EM polarizing structure includes a two dimensional photonic unit cell array one a plane having a photonic band at Γ point, wherein a plurality of frequency bands at Γ point are sufficiently separated, each of said frequency bands has a polarization state. An output EM wave is generated around an operation frequency corresponding to one of frequency bands at Γ point. The said EM polarizing structure is used to process said non-in-plane input EM wave thus outputting a polarized EM one.

In one aspect of the invention, the refractive index of said medium node is different from that of surrounding background medium.

In an aspect of the invention, an electromagnetic (EM) wave polarizing structure comprises a two dimensional planar pattern structure having medium nodes, wherein said medium nodes are regularly distributed as a plurality of planar photonic unit lattice cells being two-dimensional on a plane, each of said planar photonic unit lattice cells is identical and has an operation axis, of which direction passes a diagonal of said photonic unit lattice cell, and said medium nodes within each of said photonic unit lattice cells distributed asymmetrical with respect to said operation axis direction are identical at each lattice point, wherein each of said photonic unit lattice cells is an in-equilateral parallelogram. Said EM wave polarizing structure thus processes a non-in-plane EM wave at around an operation frequency associated with said EM wave polarizing structure and outputs a polarized EM wave.

In an aspect of the invention, an EM wave polarizing device includes the foresaid EM polarizing structure, wherein said photonic unit cells have a photonic crystal band structure, in which said operation frequency is selected close to one of frequency bands of said photonic crystal band structure. A non-in-plane EM wave emitting source structure associated with said EM polarizing structure emits a non-in-plane EM wave at around said operation frequency. Said EM wave polarizing structure processes said non-in-plane EM wave and said device thus outputs a polarized EM wave.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

According to electromagnetic wave theory, a non-polarized electromagnetic wave (EM wave) can decompose into any two independent orthogonal components: for instance, a TE mode and a TM mode, which correspond to two mutually perpendicular eigen modes with electric field orthogonal to each other. If an EM wave only includes TE mode component or TM mode component, the EM wave is polarized. The EM wave mentioned herein includes visible light. A non-polarized EM wave can become polarized in TM-mode or in TE-mode if it interacts with a special device or materials. The EM wave polarization mechanism for a non-polarized EM wave will be described below. Thereafter, a LED structure of the invention will be taken as an example for description. However, the invention is not limited to this example. It also works for a resonant cavity light emitting diode (RCLED), a vertical cavity surface emitting laser (VCSEL), organic light emitting diode (OLED), or polymeric light emitting diode (PLED).

The invention uses a two-dimensional asymmetric photonic crystal cell array to polarize an EM wave into TE mode polarization or TM mode polarization, depending on an operation frequency at Γ point (higher symmetric point of said unit cell array structure), in association with an operation frequency, in which several eigen modes of frequency band with degenerated polarization states are removed.

Figure 1:
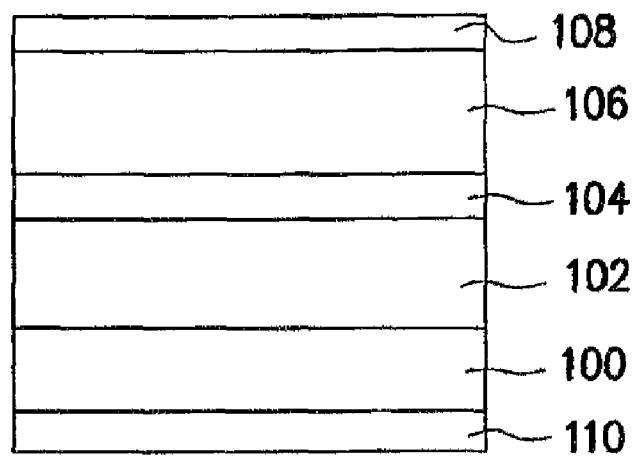
FIG. 1 is a schematic side view of a conventional light emitting diode (LED) structure.
Figure 2:
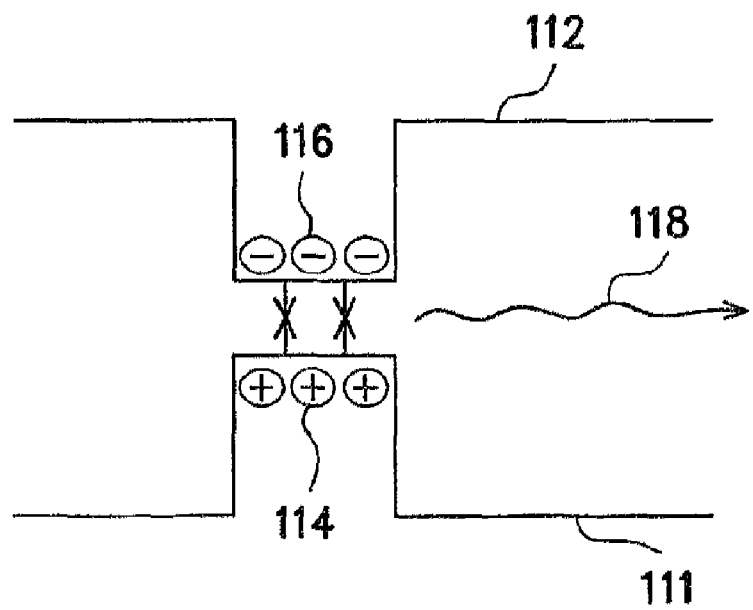
FIG. 2 is a schematic view of the light emitting mechanism of the LED.
Figure 3A:
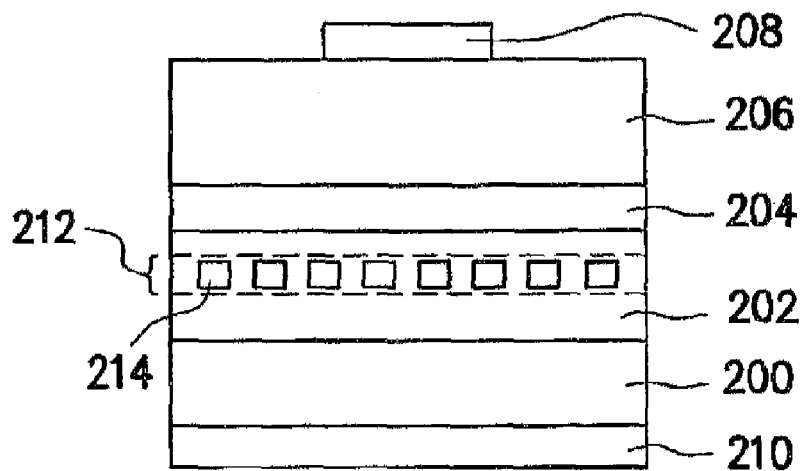
FIGS. 3A, 3B and 3C are schematic cross-sectional views of an exemplary LED according to an embodiment of the invention.
Figure 3B:
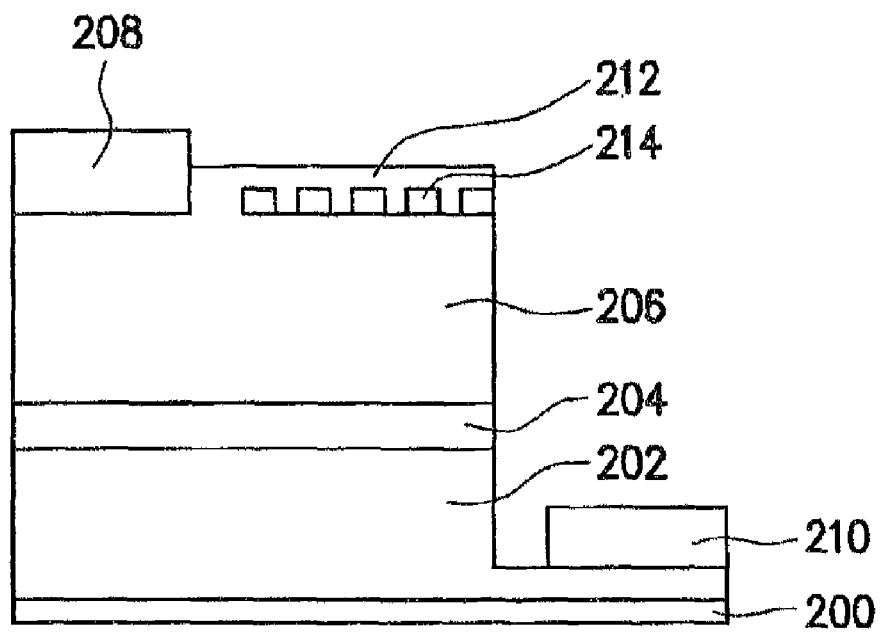
Figure 3C:
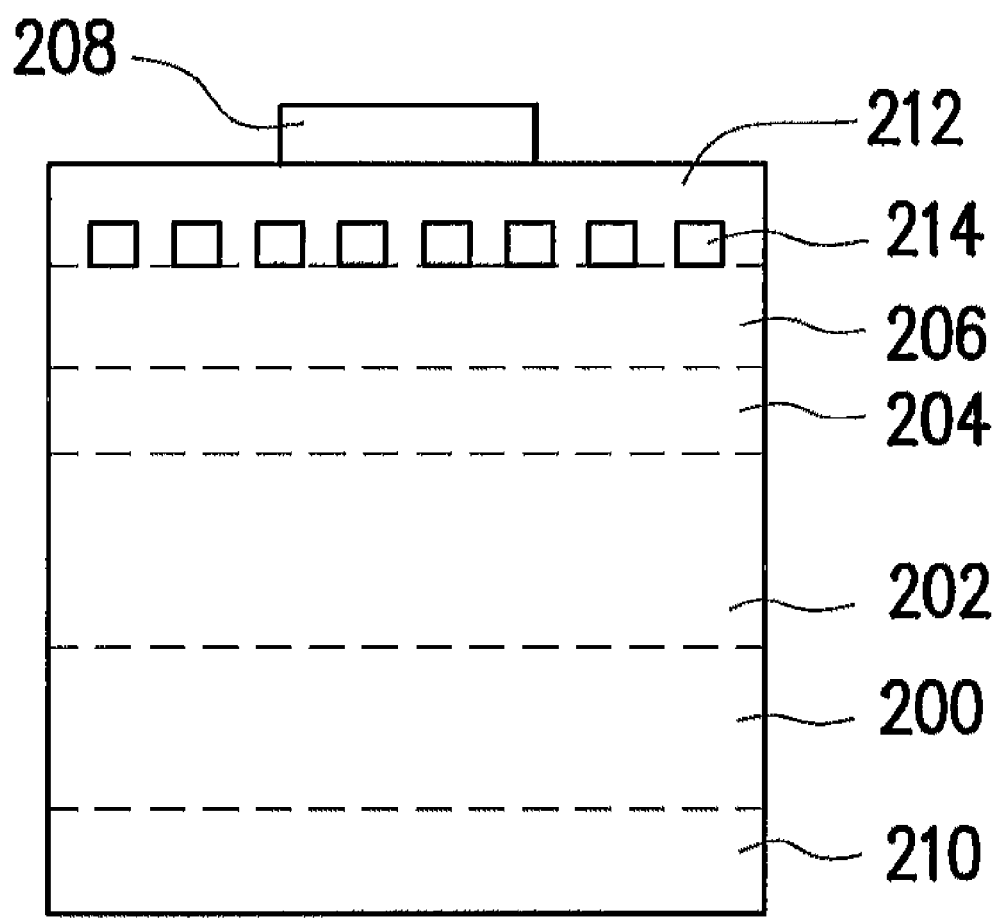

FIGS. 3A, 3B, and 3C are schematic cross-sectional views of a LED according to an embodiment of the invention. Referring to FIGS. 3A and 3B, the LED structure includes a substrate 200. The substrate 200 is made of, such as, a transparent material, silicon, sapphire, or spinel. A clad layer 202, an active layer 204, and a clad layer 206 are formed on the substrate (or an electrode layer in FIGS. 3A and 3C) 200 in sequence, wherein the clad layer 202 of FIG. 3A (or the clad layer 206 of FIGS. 3B and 3C) includes an EM wave polarizing structure layer 212. The EM wave polarizing structure layer 212 has the medium nodes 214, which are arranged as a two-dimensional asymmetric photonic unit lattice cell array made up of in-equilateral parallelogram unit lattice cell.

Herein, the layer 200 and the layer 210 in FIGS. 3A and 3C can be an electrode layer and a supporting layer (a substrate) respectively. If the light emitting device structure is a resonant cavity light emitting diode (RCLED) or a vertical cavity surface emitting laser (VCSEL). A distributed Bragg reflector is inserted or fabricated inside the clad layers 202 and 206 respectively enclosing the radiation structure 204 and the EM wave polarizing structure 214.

The description of the distributed Bragg reflector can be referred to Carl Wilmsen, Henry Temkin and Larry A. Coldren, Chapter 3, Section 3.2.2 Reflectors "*Vertical Cavity Surface Emitting Laser* (Cambridge University Press, Cambridge, 1999)".

From the point of optics, the two-dimensional periodic (or photonic unit lattice cell) array composed of medium nodes 214 can be considered as a photonic crystal (or light crystal) of the EM wave. It's just like electrons move inside a periodic electric potential (crystal lattice). It can be understood herein that, a three-dimensional structure can be constructed via two-dimensional unit lattice cell array layers, and the invention is not limited to the two-dimensional array of a single layer. A two-dimensional symmetric photonic unit lattice cell array according to the invention has an operation axis, which passes a diagonal of said unit lattice cell. Generally, the TE mode or TM mode components of said non-polarized EM wave is degenerate on the medium nodes 214 (or at the point Γ of said symmetric photonic unit lattice cell array). In short, the TM and TE modes at Γ point have the same frequency response and cannot be separated from each other under this circumstance.

The medium nodes depicted in the invention are distributed asymmetrical with respect to the operational axis direction and identical. However, when an incident non-polarized EM wave interacts with foresaid two-dimensional planar asymmetrical photonic unit lattice cell array, the TM and TE modes of foresaid EM wave on the medium nodes 214 are separated as a single or few similar eigen modes because of different frequency and mode responses of foresaid non-polarized EM wave. More detailed description will be made with reference to FIGS. 4A, 4B, FIGS. 9A, 9B, 9C, and 9D.

Then, two electrode layers 210, 208 are disposed on both sides of the structure. Also, FIG. 3A only depicts an example of the polarizing layer 212 with one layer. However, multiple-layered structure can also be used depending upon the design requirements, and the medium nodes 214 can penetrate or not penetrate the polarizing layer 212, and another EM wave polarizing layer can also be disposed in the clad layer 206, for example. Also, since the electrode layer 210 can also reflect the EM wave (light) emitted from the active layer 204, the reflected EM wave (light) passes the EM wave polarizing layer 212 again, so as to enhance the polarization effect.

Figure 4B:
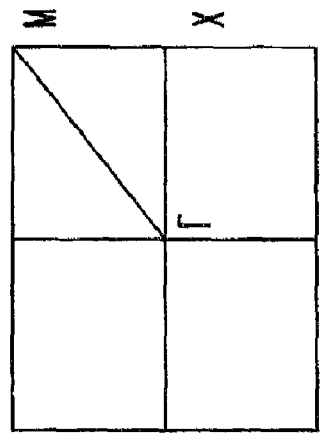
FIG. 4B is a schematic plane view of Γ-M, Γ-X on the two-dimensional reciprocal lattice vector space corresponding to a photonic unit lattice cell E1 of FIG. 4A.
Figure 4A:
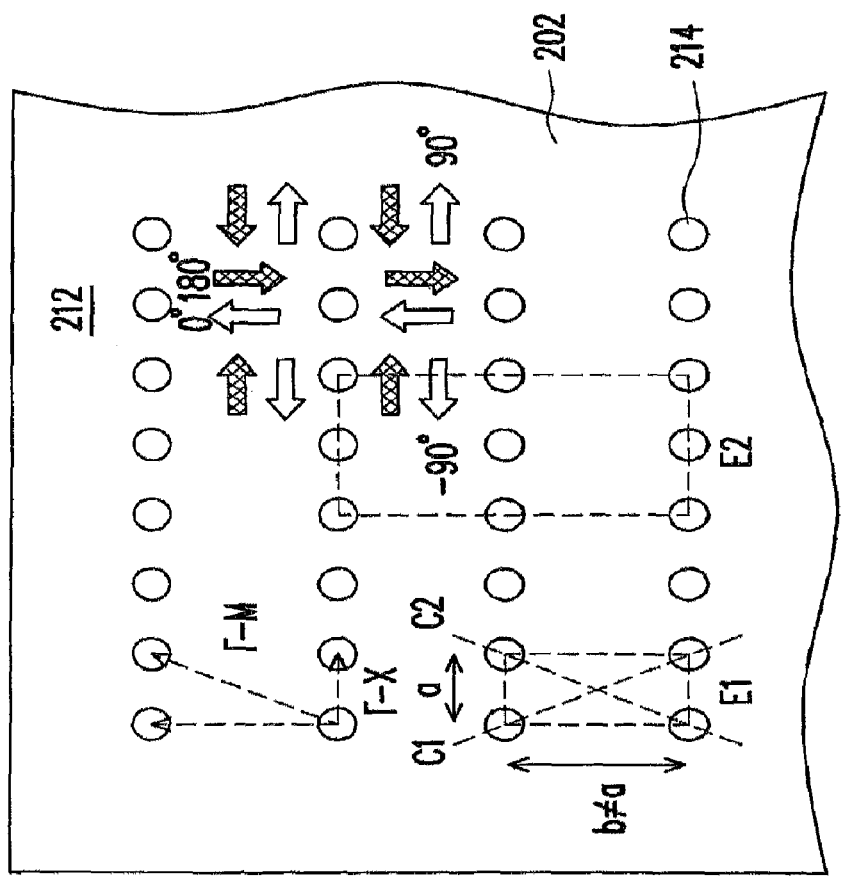
FIG. 4A is a schematic top plane view showing the relationship between the medium nodes on the EM polarizing layer and an input EM wave according to the embodiment of the invention.

The EM wave polarization mechanism and the medium nodes 214 on the polarizing layer 212 will be described below. FIG. 4A is a top plane view of the polarizing layer (XZ plane view) showing the relationship between the non-in-plane incident EM wave and the two-dimensional rectangular photonic unit lattice cell array structure of medium nodes 214 on the EM wave polarizing layer 212. FIG. 4B is a schematic plane view of Γ-M, Γ-X on the reciprocal lattice vector plane corresponding to a unit lattice cell of FIG. 4A. If the medium nodes are distributed as a two-dimensional rectangular unit lattice cell array on a XZ plane, X directional unit is a, Z directional unit is b, and the corresponding reciprocal lattice unit vectors on the reciprocal lattice plane are thus $G_x=2\pi/a$ and $G_z=2\pi/b$ respectively as shown in FIG. 4B. The projected electric field components of the incident EM wave parallel to X axis and Z axis are perpendicular to each other in FIG. 4A. For example, one of the electric fields oscillates back and forth between 0 degree and 180 degrees, and the other electric field oscillates back and forth between −90 degrees and +90 degrees. If the projected foresaid EM incident and reflected wave number difference component ($\Delta K_{//}$) on the XZ plane is equal to the sum of any integral multiples of two reciprocal lattice unit vectors $G_x=2\pi/a$, $G_z=2\pi/b$ the EM wave will generate a Bragg diffraction wave on the XZ plane, that is, Equations (1) and (2):

$$\Delta \vec{K}_{//}=m\vec{G}_x+n\vec{G}_z, \quad (1)$$

$$\Delta \vec{K}_{//}=(\vec{K}_r-\vec{K}_i)_{//}, \quad (2)$$

where m and n are integers and $\vec{K}_i$ and $\vec{K}_r$ are EM in-plane projection components of incident and reflected wave numbers respectively. At this instant, the EM wave will be strongly modulated (similar to resonance) by the two-dimensional unit lattice cell array. As a result, the polarization state of the EM wave can be changed. The two-dimensional unit lattice cell array structure of the medium nodes 214 can be, e.g., the E1 rectangular in FIG. 4A, with two unit axes a, b different from each other. This two-dimensional array structure is composed of, for example, rectangular photonic unit lattice cells. The foresaid two-dimensional array has an operation axis, for example, one of the two diagonals C1, C2 of E1. The rectangular unit cell is asymmetric with respect to C1 or C2. Here the E2 rectangular in FIG. 4A is "not" true a two-dimensional photonic unit lattice cell but E1 is one. In fact E1 is the "smallest basic unit" of said two-dimensional unit lattice cell array in FIG. 4A. E1 repeats in X and Z directions to form the two-dimensional unit lattice cell array without any photonic point defect as shown in FIG. 4A.

The position of the medium node 214 in FIG. 4B is referred as Γ point. The diagonal direction is defined as Γ-M and the direction from point Γ to the adjacent medium node 214 is defined as Γ-X. The asymmetrical photonic unit lattice cell structure of the invention takes, for example, the diagonal C1 as the desired operation axis, and the medium nodes 214 around the operation axis are distributed asymmetrical with respect to the operation axis. As long as the medium nodes 214 are asymmetrical with respect to the operation axis direction, when a non-polarized EM wave is incident on the two-dimensional photonic unit lattice cell array as shown in FIG. 4A, i.e. E1 cell array, the TE and TM components originally degenerate on the medium nodes (Γ point) will have different responses to the frequency band shift resulted from the interaction with said asymmetrical photonic unit lattice cell array structure, that is, they will be separated or converted. Therefore, if the parameters of foresaid asymmetric photonic unit lattice cell are properly selected and satisfy equation (1), a single or few nearly similar eigen modes of, for example, one of the TE and TM modes can be pre-selected. The mechanism of separating or converting TE and TM modes will be further described in FIGS. 6A-6B, FIGS. 7A-7B, FIGS. 8A-8B, and FIGS. 9A-9D.

Furthermore, the asymmetrical spatial distribution of medium nodes with respect to the operation axis direction means that most medium nodes 214 are globally distributed asymmetrical, or all the medium nodes are distributed asymmetrical with respect to the operation axis direction. In other words, under a special circumstance, the medium nodes 214 can be locally distributed symmetrical in particular positions, but still being substantially asymmetrical with respect to the operation axis direction as a whole. The examples 500e and 500f are shown in FIG. 5B. If the foresaid two-dimensional array is properly chosen, an incident non-polarized EM wave with a mix of TE and TM modes can be further converted and separated into the polarized (purely TE or TM mode or modes) output EM wave. It will be further described with reference to FIGS. 9A, 9B, 9C, and 9D.

Figure 5A:
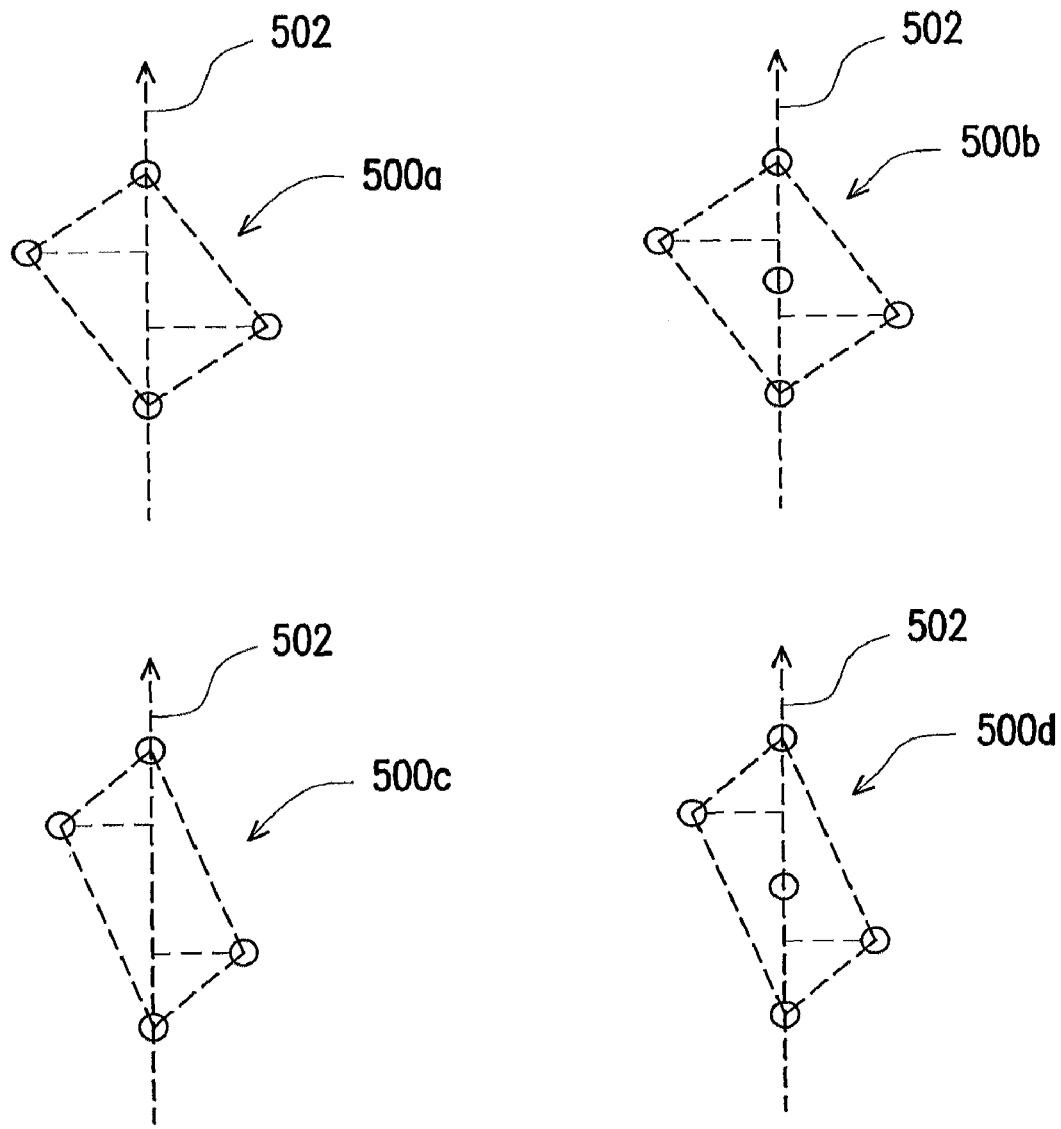
FIG. 5A shows several different two-dimensional photonic unit lattice cell structures respectively according to the invention.
Figure 5B:
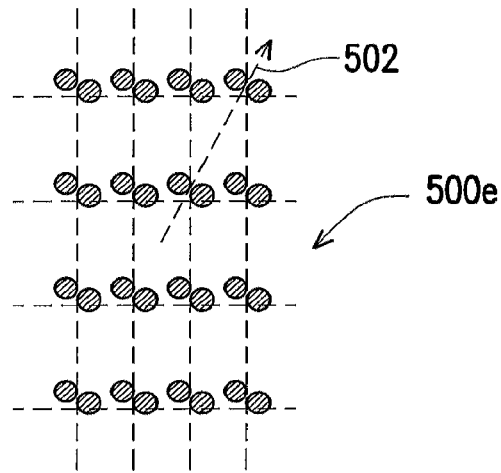
FIG. 5B are schematic plane views which show a two-dimensional photonic unit lattice cell array made up of medium nodes according to the invention.
Figure 5B:
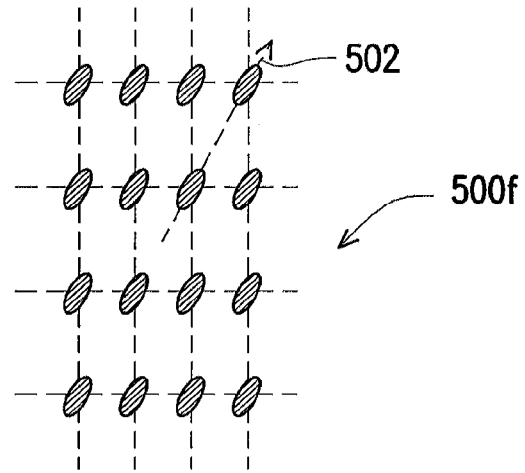
Figure 5B:
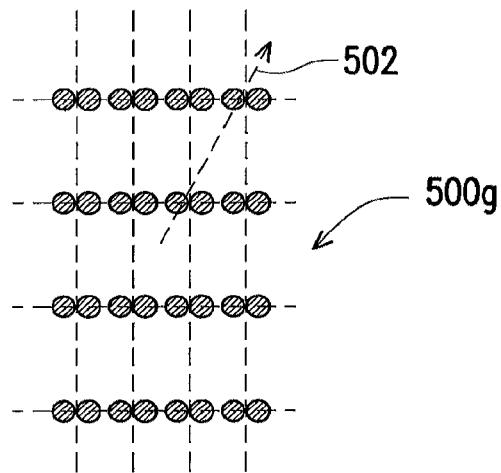
Figure 5B:
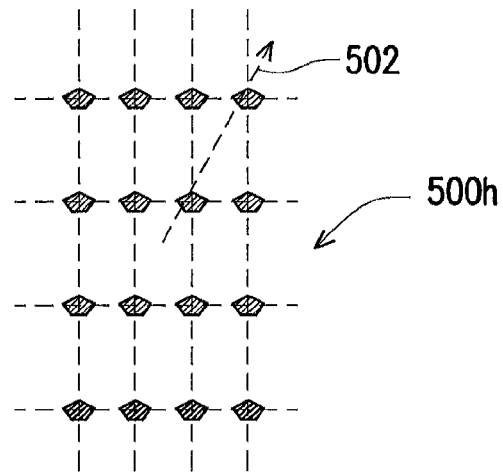

FIG. 5A shows several different two-dimensional photonic unit lattice cell structures respectively according to the invention. FIG. 5B are schematic plane views which show a two-dimensional photonic unit lattice cell array made up of medium nodes according to the invention. In FIG. 5A, as for the operation axis 502, the examples 500a, 500b, 500c, and 500d are four specific embodiments of a unit cell structure and the examples 500e, 500f, 500g, and 500h are four specific embodiments of a unit cell array structure, as shown in FIG. 5B. The example 500a is a rectangular unit lattice cell. It can be known from the relationship shown by dash lines that the medium nodes 214 around are distributed asymmetrical with respect to the operation axis direction 502. Also, the example 500b is a rectangular unit lattice cell with a center lattice point, and the medium nodes 214 around are distributed asymmetrical with respect to the operation axis direction 502 either. Also, the unit lattice cell structure can be, for example, the in-equilateral parallelogram in the example 500c, and the medium nodes 214 around are distributed asymmetrical with respect to the operation axis direction 502 as well. Similarly, the in-equilateral parallelogram in the example 500d with a center lattice point also meets the requirements of the asymmetrical structure according to the invention. The examples 500e and 500f show, furthermore, for example, the structures for the medium nodes 214. However, FIGS. 5A and 5B are embodiments of the invention. And as for the operation axis 502, as long as the medium nodes are distributed asymmetrical as a two-dimensional photonic unit lattice cell in a cell array structure, the polarization effect disclosed in the invention will be achieved as well. The examples 500g and 500h in FIG. 5B show the cases in which the shape or the distribution of said medium node on said plane is distributed asymmetrical with respect to said operation axis direction and identical. For example, the shape of said medium node 214 comprises one of the followings: circle; triangle; square; rectangle; ellipse; pentagon; or complex pattern oriented asymmetrical with respect to said operation axis direction.

Figure 6A:
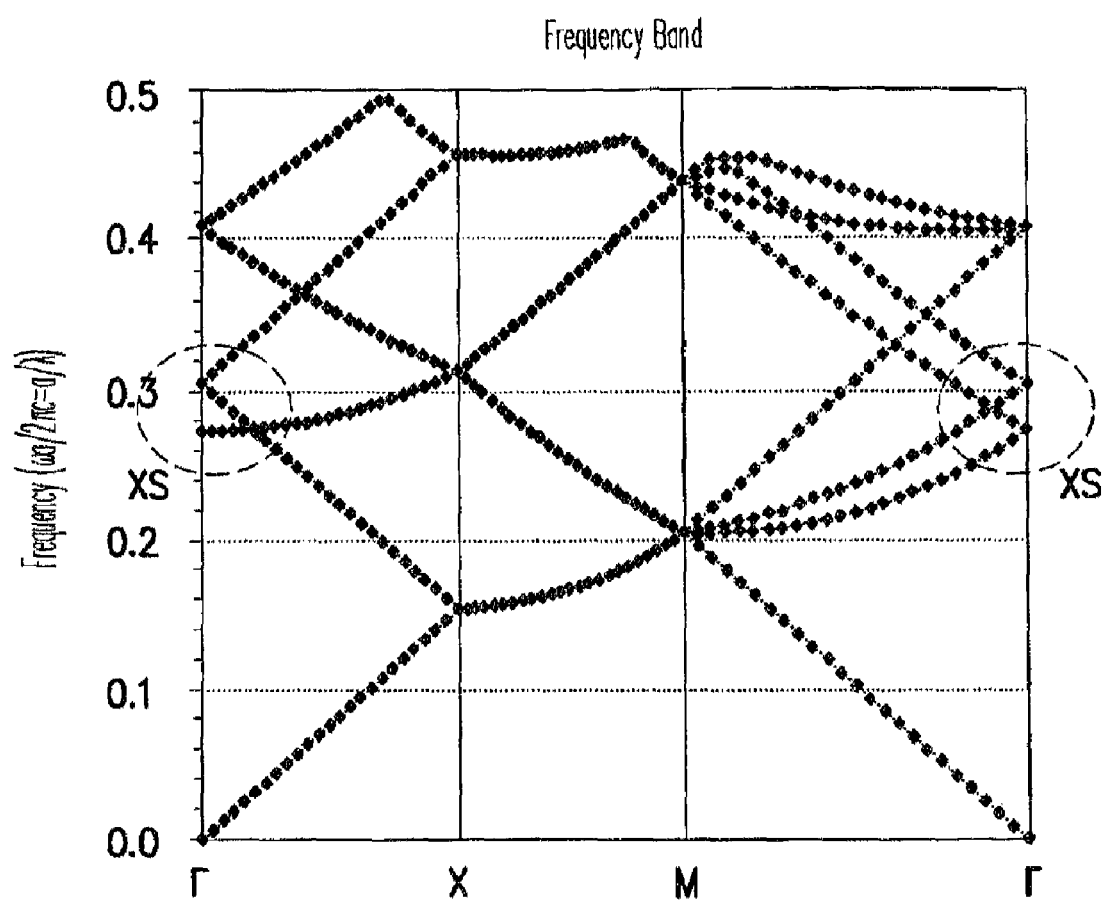
FIGS. 6A and 6B are photonic bands (band dispersions) of a two-dimensional asymmetric rectangular photonic unit lattice cell array as a function of the projected incident wave number $Ki_{//}=2\pi/\lambda_{//}$ with respect to point Γ according to the invention.
Figure 6B:
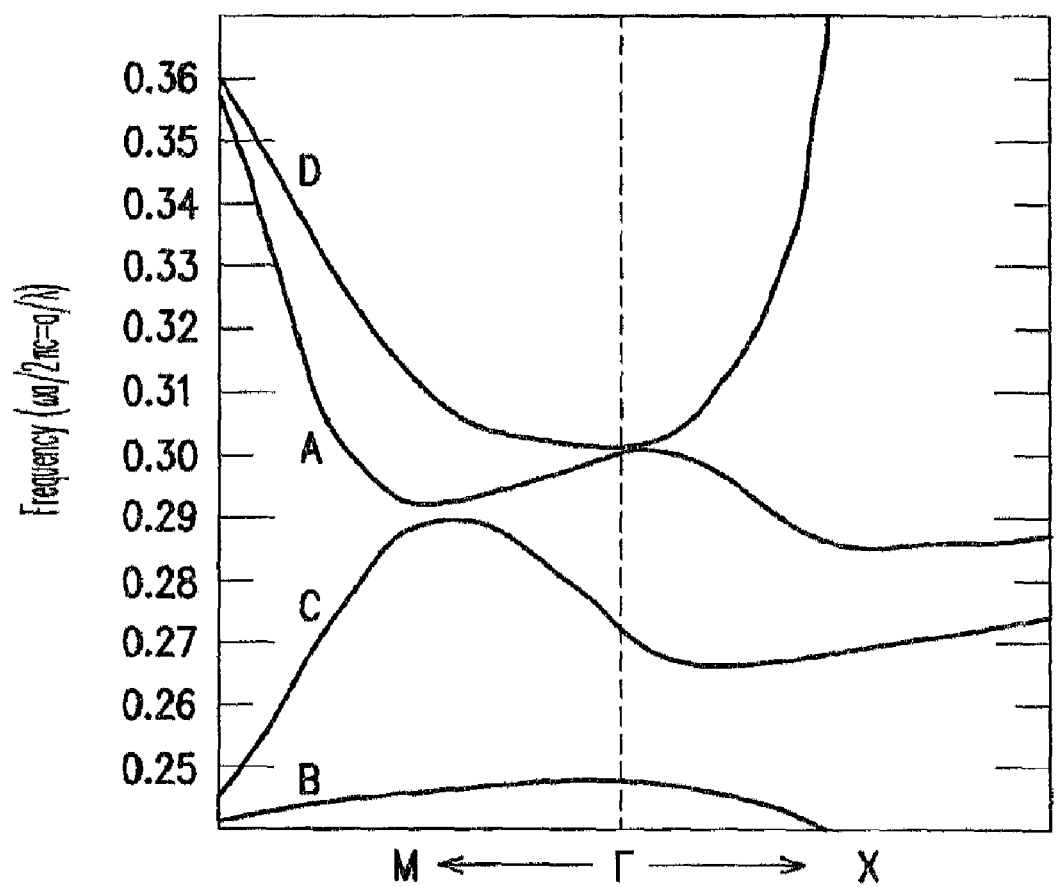
Figure 7A:
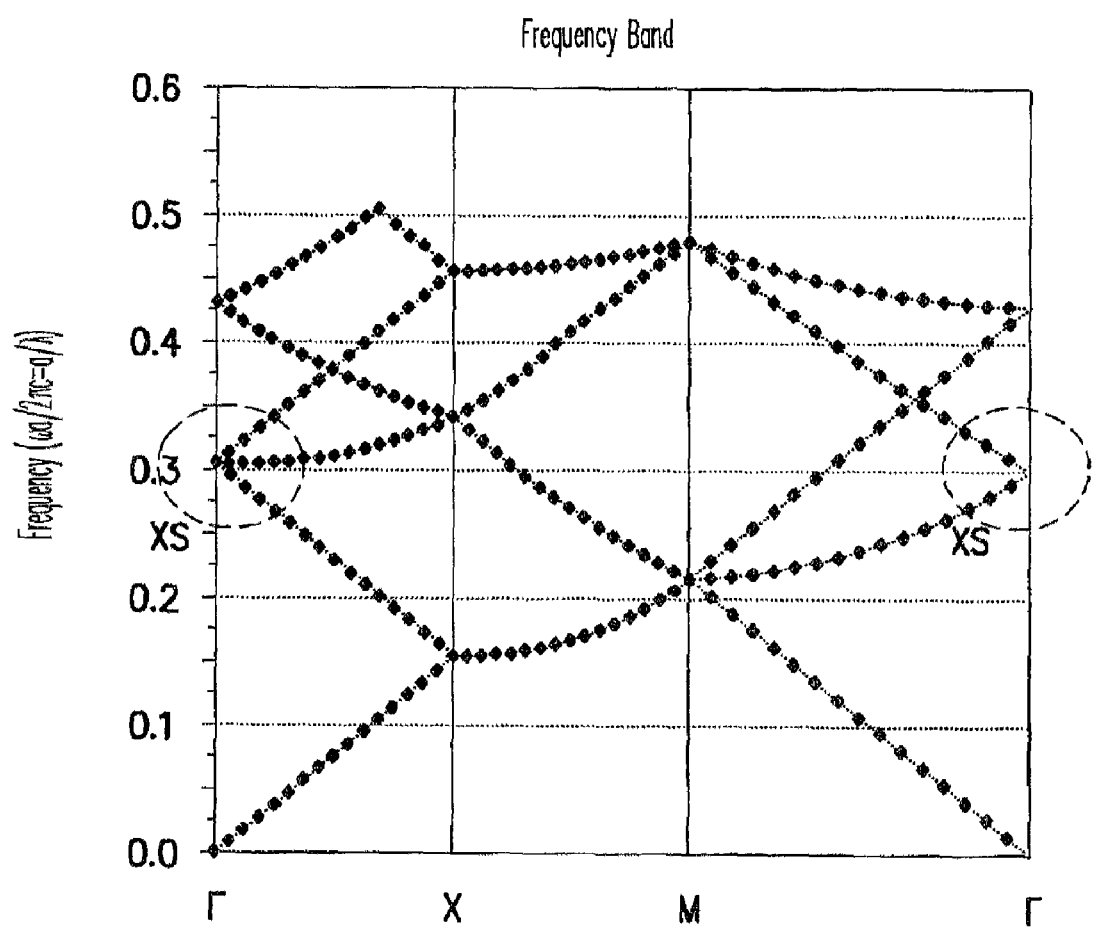
FIGS. 7A and 7B show photonic bands (band dispersions) of a two-dimensional symmetric square photonic unit lattice cell array with a Γ point degenerate as a function of an incident wave number projection $Ki_{//}=2\pi/\lambda_{//}$ with respect to Γ point.
Figure 7B:
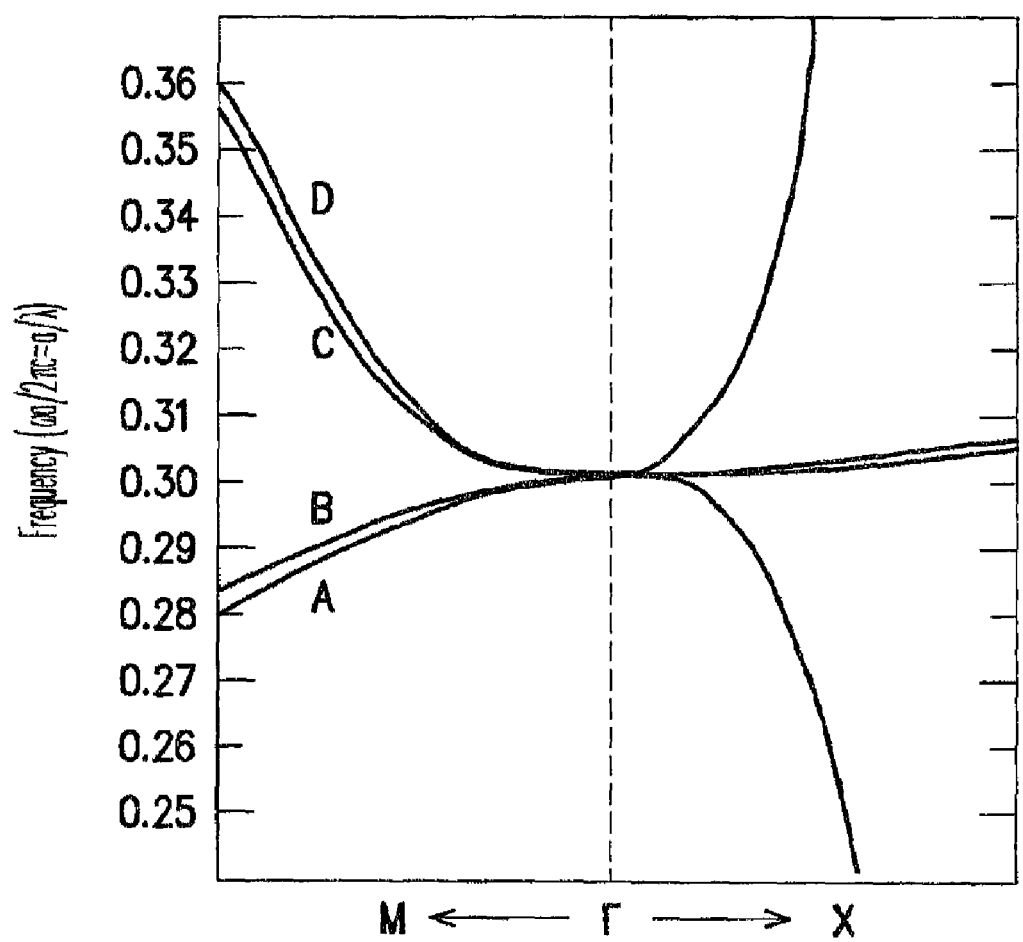

The EM wave polarization generation mechanism of the invention will be described below. FIGS. 6A and 6B show photonic bands (band dispersions) of a two-dimensional asymmetrical rectangular unit lattice cell array as a function of an in-plane incident and reflected wave number projection difference ($\Delta K_{//}$) with respect to $\Gamma$ point, wherein $\Delta K_{//}$ vector is parallel to the two-dimensional asymmetric rectangular unit lattice cell array plane according to the invention ($\lambda$=one EM wavelength). The photonic band can be determined by FDTD (Finite Difference Time Domain) method, for example. FIGS. 7A and 7B show photonic bands (band dispersions, or frequency bands) of a two-dimensional square unit lattice cell array as a function of an incident and reflected wave number projection difference $\Delta K_{//}$) with respect to $\Gamma$ point, wherein $\Delta K_{//}$ vector is parallel to a two-dimensional symmetrical square unit lattice cell array plane. For example, eigen modes A and B (resonant band) in the $\Gamma$-M direction are approximately degenerated (overlap) around an operation frequency (a/$\lambda$=0.30 in vertical axis) at $\Gamma$ point in FIG. 7B. It means that eigen modes A and B have the same frequency response, however, the foresaid structure of the invention in FIGS. 6A and 6B can separate eigen modes A and B since the frequency and mode responses of eigen modes A and B are no longer the same around an operation frequency at $\Gamma$ point. In the same way, eigen modes C and D (resonant band) also can be separated. In FIGS. 6A-6B, the dielectric constants of the medium node and the background dielectric layer are 10.56 and 10.92 respectively. The length ratio of long unit axis (b) to short unit axis (a) of a rectangular unit cell in FIG. 6B (or medium node period) is b/a=1/0.85, r/a=0.252, c=light velocity, $\lambda$=one EM wavelength, $\omega$=angular frequency of an EM wave, a=400 nm, r=radius of a medium node hole. FIG. 6B is an enlarged view of the XS area of FIG. 6A, wherein eigen modes A, B, C, and D are separated completely and are no longer degenerated near an operation frequency (a/$\lambda$=0.30) as shown in the vertical axis in FIG. 6B. As for the four resonant bands of eigen modes A, B, C, and D on the photonic band of a two-dimensional square unit lattice cell array structure as shown in FIG. 7B and FIG. 7B, FIG. 7A is a foresaid photonic band (or band dispersion) of a square unit lattice cell array in a wide frequency range. FIG. 7B is an enlarged view of the XS area of FIG. 7A. It can be known from FIG. 7B in the $\Gamma$-M direction that eigen modes A and B at $\Gamma$ point are degenerate (overlap) at one frequency, and eigen modes C and D at $\Gamma$ point are degenerate (overlap) at another frequency, wherein the dielectric constants of the medium nodes and their background dielectric layers are 10.56 and 10.92 respectively, and the length ratio of a hole radius of the medium node (r) to a square unit cell period (a) is r/a=0.252, a=400 nm. In FIGS. 6A, 6B of the invention, eigen modes A and B are separated at different frequencies, and eigen modes C and D are also separated at different frequencies. Therefore, when the parameters of asymmetric unit cell are properly selected, for example, only one of said eigen modes B and C will be selected, to obtain the polarization effect. The related basic conceptions and calculation principle of photonic bands(or frequency bands) in photonic crystal band structure and the electric (or magnetic) field of the corresponding eigen modes in FIGS. 6A, 6B, FIG. 7A, 7B, FIGS. 8A, 8B, and FIGS. 9A, 9B, 9C, and 9D can be understood with reference to Joannopoulos et al., *Photonic Crystals, Molding the Flow of Light*, (Princeton University Press, Princeton, 1995), Meade et al. "Accurate Theoretical Analysis of Photonic Band-gap Materials", Phys. Rev. B 48, 8434 (1993), or Taflove, Allen et al., *Computational Electrodynamics: the Finite-Difference Time-Domain Method* (Boston: Artech House, c1995). (FDTD)

Figure 8A:
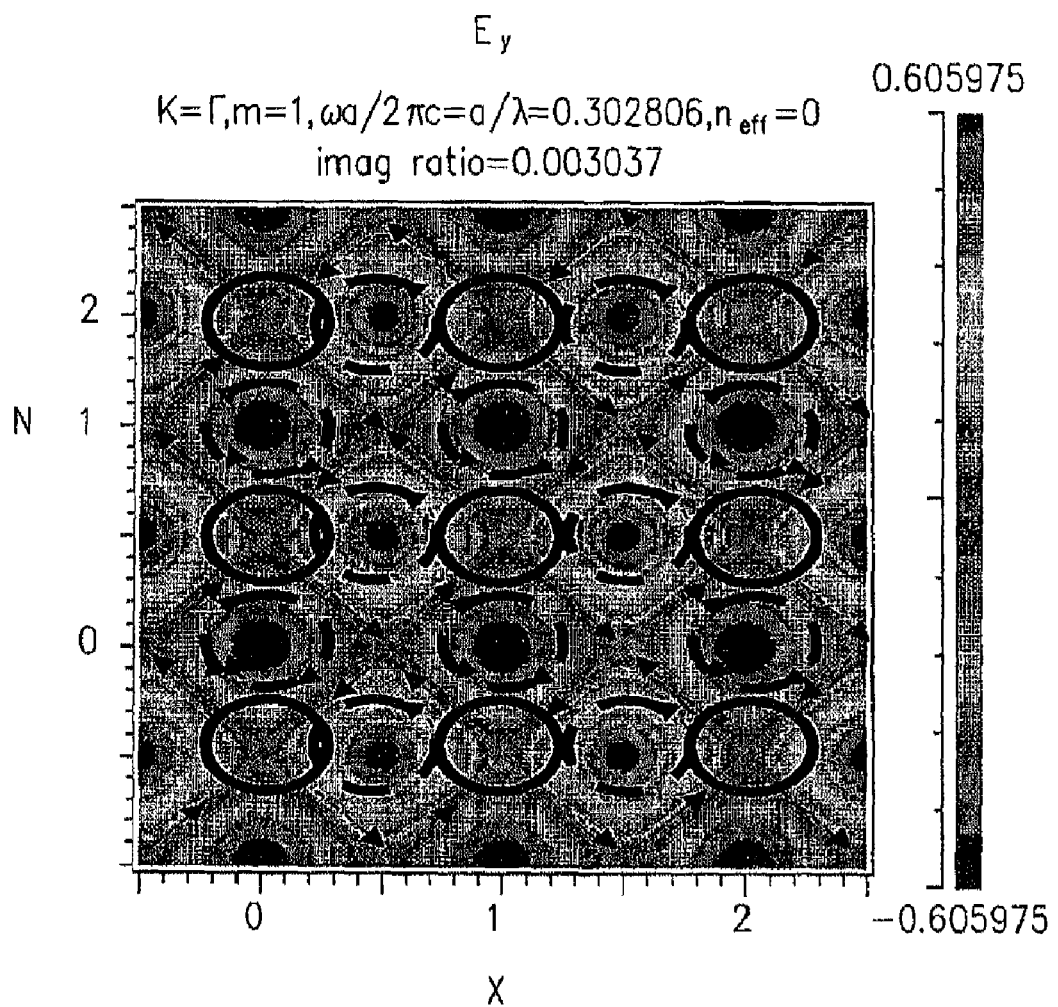
FIGS. 8A and 8B are spatial distribution views of the intensity and direction of the electric field E and the magnetic field H of eigen mode A in FIG. 7B with respect to the XZ plane, corresponding to FIG. 7B, wherein the arrows indicate the direction of the electric field (or magnetic field); the intensity of the electric field is indicated with colors; the circles of solid line indicate the medium nodes 214; and the dashed arrows and the circles indicate the direction of the corresponding electric field E (or magnetic field H).
Figure 8B:
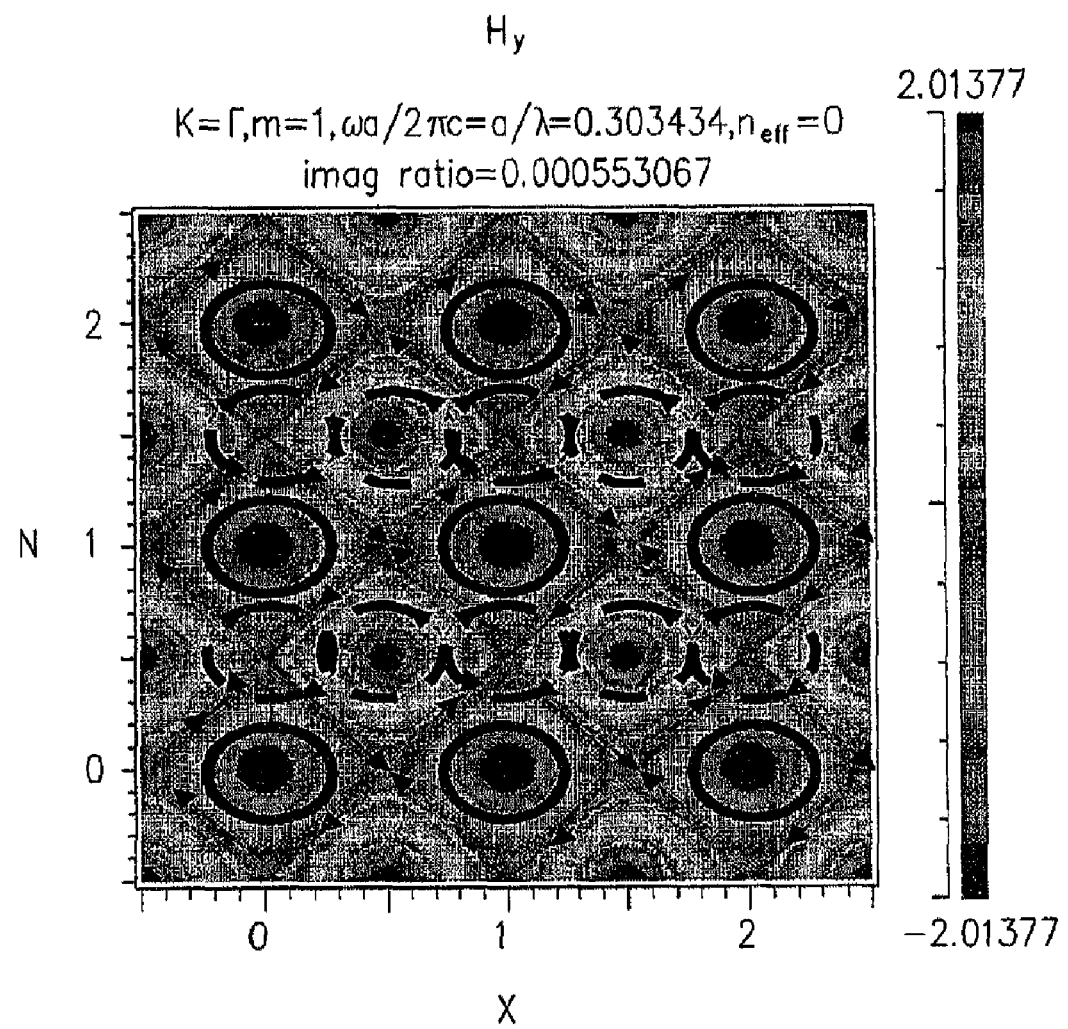
Figure 9A:
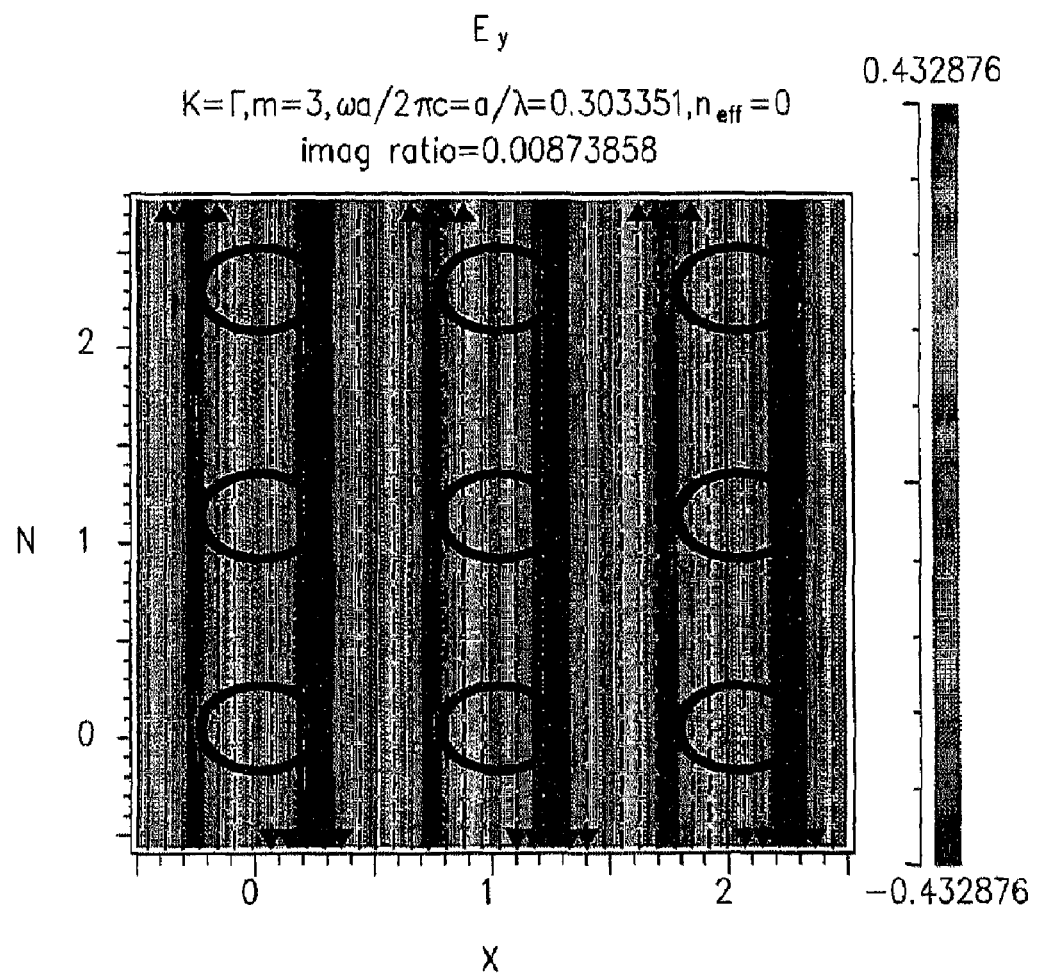
FIGS. 9A, 9B, 9C, and 9D are the spatial distributions of the intensity and direction of the electric fields of eigen modes A, B, C, and D in FIG. 6B with respect to XZ plane, corresponding to FIG. 6B, wherein the EM waves of eigen modes A, B, C, and D are shown linearly polarized in these figures respectively.
Figure 9B:
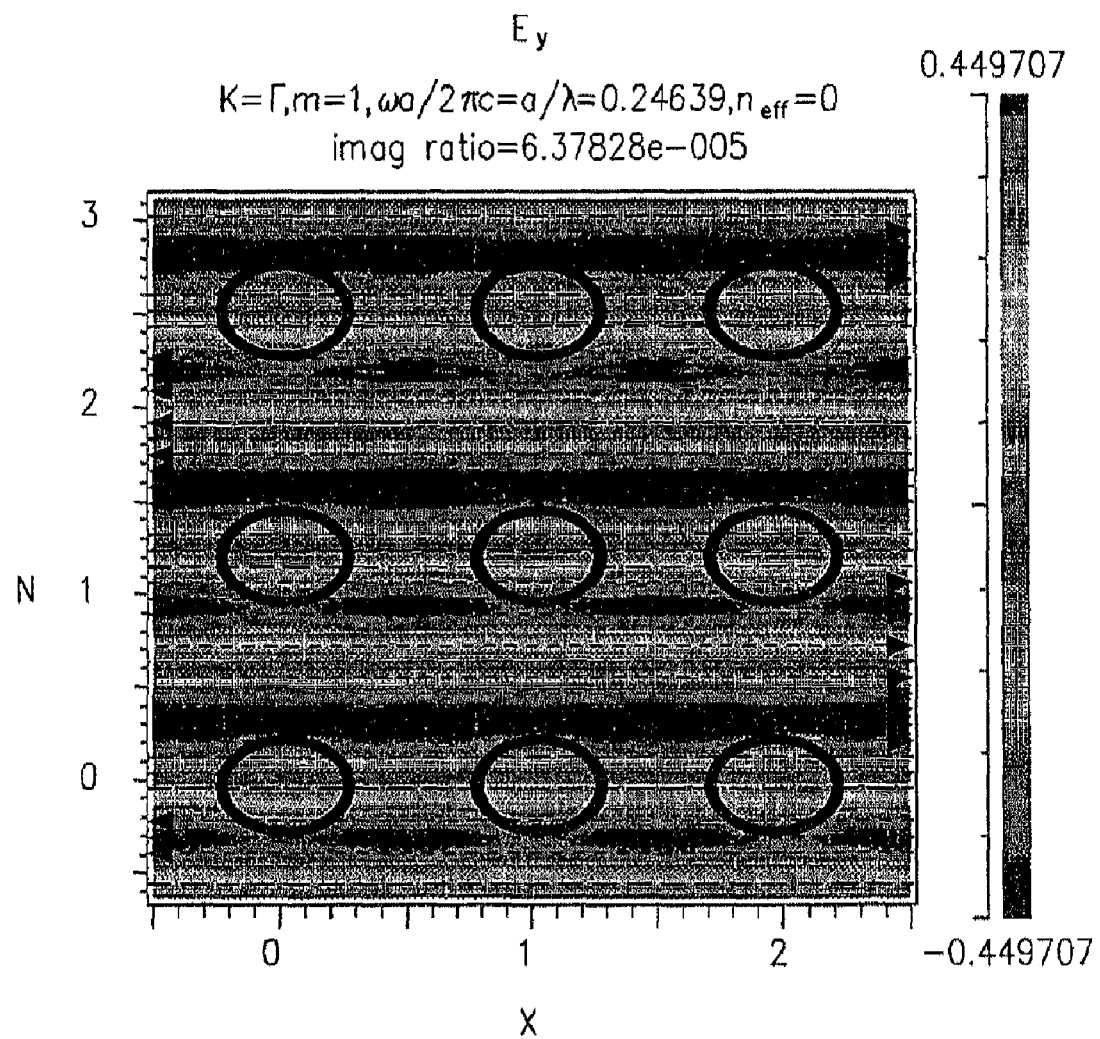
Figure 9C:
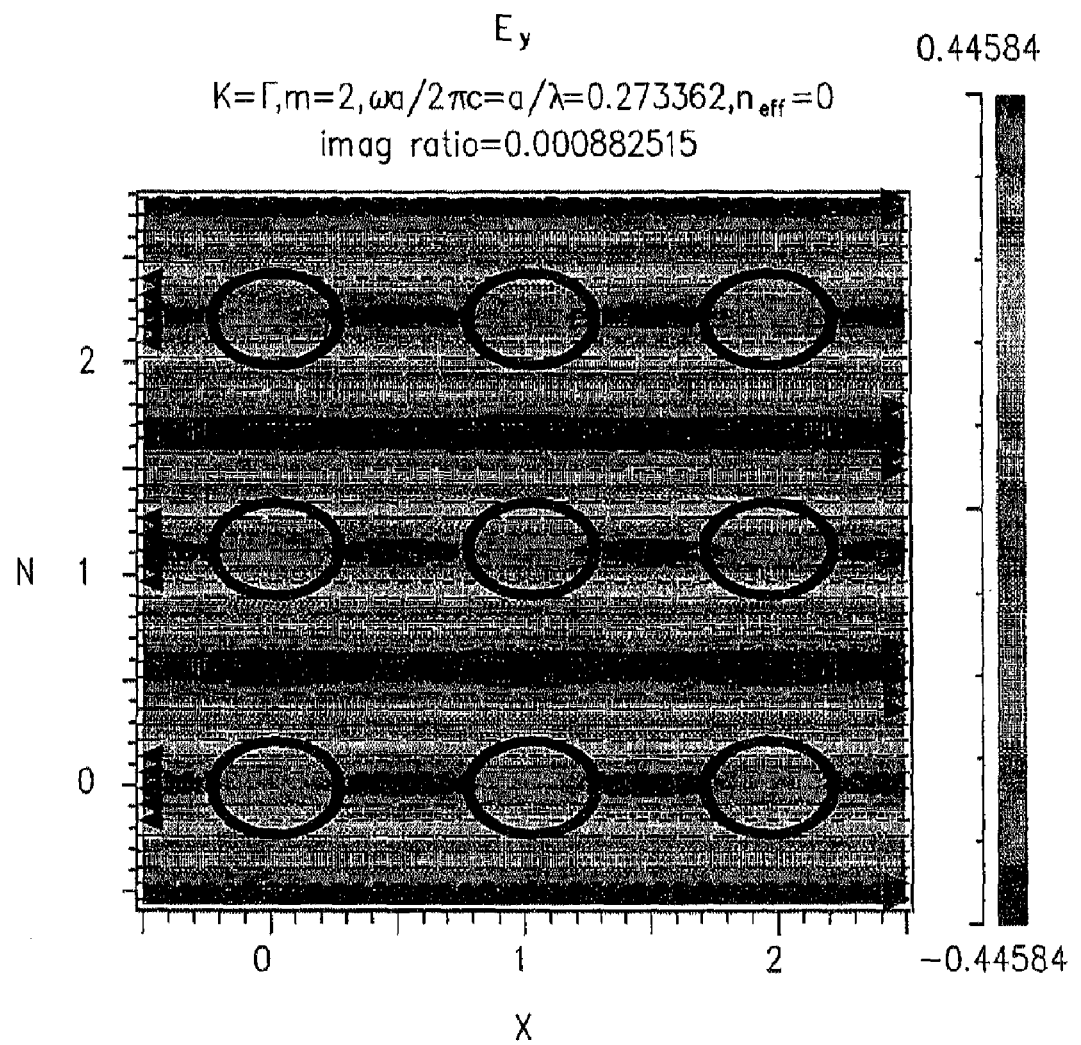
Figure 9D:
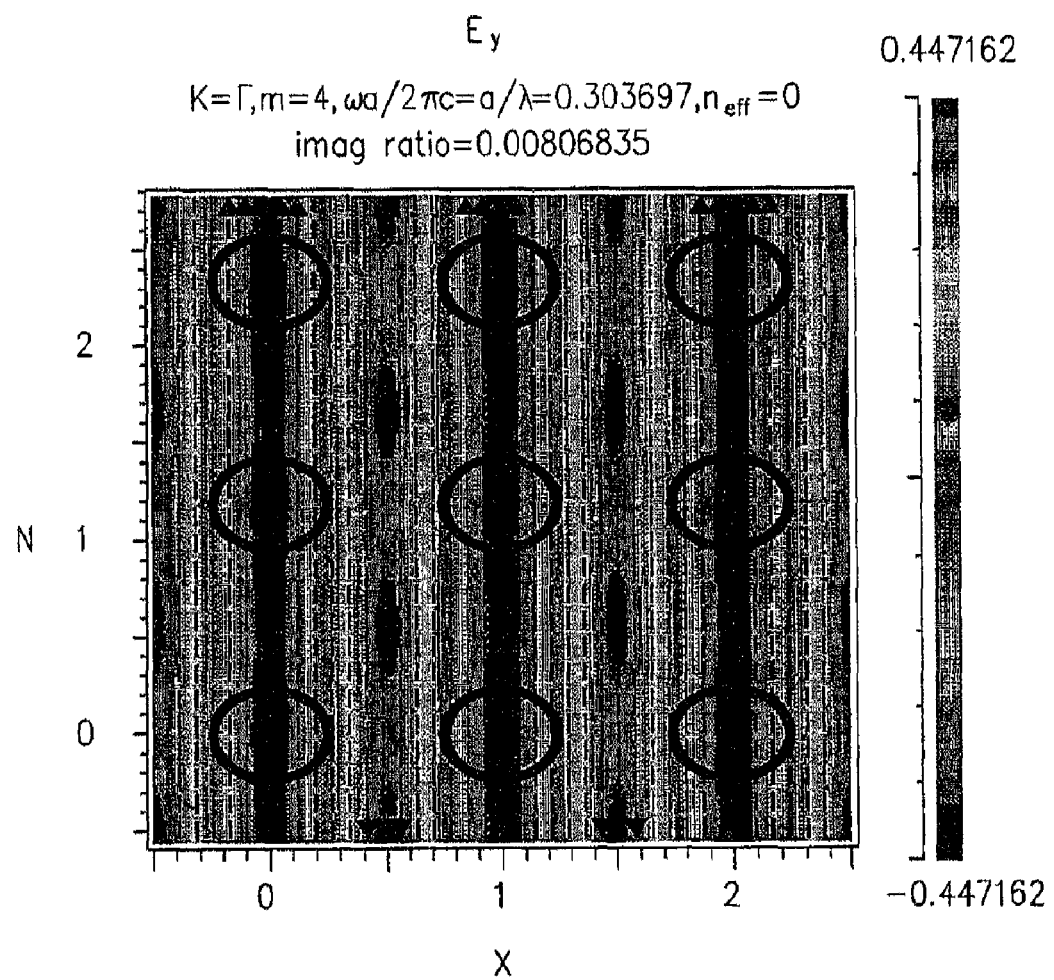

FIGS. 8A and 8B are spatial distribution views of the intensity and direction of the electric field E and the magnetic field H of eigen mode A on the XZ plane corresponding to FIG. 7B. The arrows indicate the direction of the electric field E (or magnetic field H); the intensity of the electric field E (or magnetic field H) is indicated by shading; the solid line circles indicate the medium nodes 214; and the dashed arrows and dashed circles indicate the direction of the corresponding electric field E (or magnetic field H).

FIGS. 9A, 9B, 9C, and 9D are spatial distribution views of intensity and direction of the electric fields of eigen modes A, B, C, and D on the XZ plane corresponding to FIG. 6B, wherein the EM waves of said eigen modes A, B, C, and D are linearly polarized as shown in the figures. Moreover, the corresponding frequency responses of said eigen modes A and D are close to each other, and the spatial distributions of the corresponding polarized electric fields are similar as well. Also, the spatial distributions of the corresponding polarized electric fields of said eigen modes B and C with different frequencies are also similar to each other. Therefore, a non-polarized (or a partially polarized) EM wave can be polarized, if the two-dimensional asymmetrical unit lattice cell array, r/a, and the unit cell period (or cycle) are properly selected. That is, a non-polarized incident EM wave with a particular frequency will resonate with said pre-selected two-dimensional asymmetric unit lattice cell array and an outgoing EM wave is thus polarized.

Figure 10A:
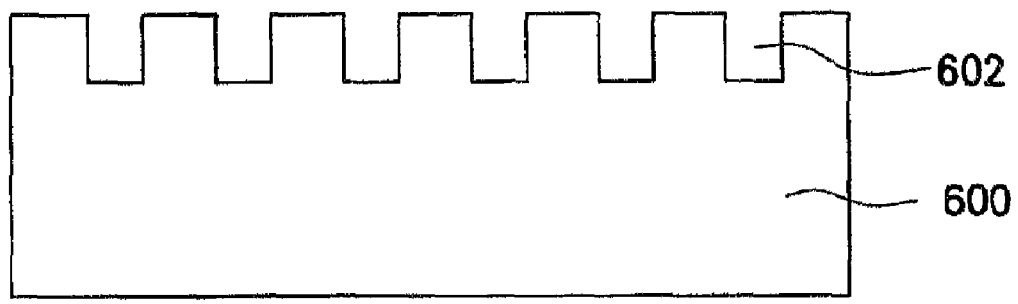
FIGS. 10A, 10B, 10C and 10D are some examples of schematic cross-sectional views of fabricating the EM wave polarizing structure according to an embodiment of the invention.
Figure 10B:
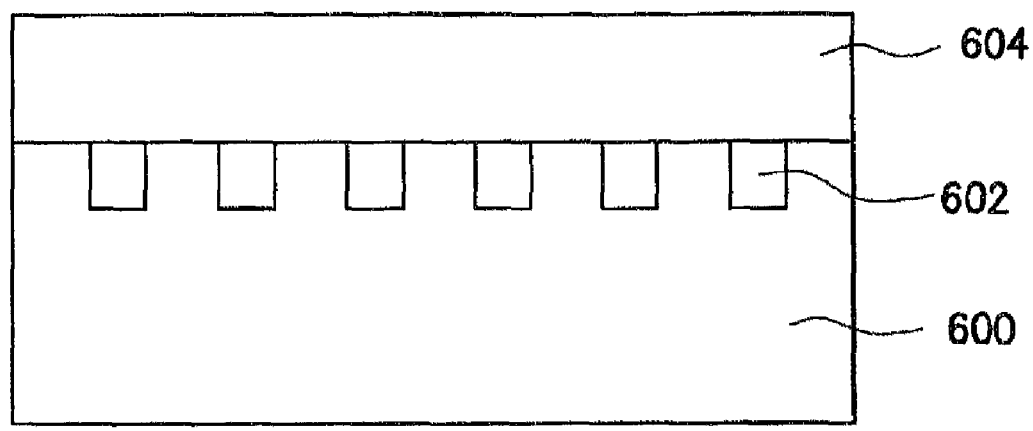

Then, an embodiment of how to fabricate said EM polarizing structure of the invention will be described below. FIGS. 10A and 10B are cross-sectional views of said EM wave polarizing structure according to an embodiment of the invention. In FIG. 10A, multiple recesses or through holes 602 are formed on a semiconductor material layer 600, wherein the recess is taken as an example herein. The positions of the recesses 602 are the positions of medium nodes 214 in FIGS. 3A, 3B. If one EM wave polarizing structure is required, the semiconductor material layer 600 can be used as a substrate. However, if the semiconductor material layer 600 is used to fabricate LED of FIGS. 3A-3B, the semiconductor material layer 600 can be part of the clad layer.

The recesses 602 (or said medium nodes) can be formed through, e.g., photolithographic and etching process of the semiconductor technique. In order to obtain the desired polarization effect, the recess depth (or the depth of said medium node) in the direction vertical to the semiconductor material layer 600 is, e.g., set about a wavelength. However, the recess depth is not limited, and the recess depth may vary depending on the design, thus leading to different polarization effects. Therefore, the recess depth (or the depth of said medium node) can be larger than or equal to $\lambda$/4. In order to have different refractive indexes, the recesses 602 (or said medium nodes) can be holes, or holes filled with dielectrics, holes filled with organic, holes filled with metal, holes filled with polymer, holes filled with solid, holes filled with stacked layers of solids, or holes filled with liquid. Furthermore said recesses 602 (or said medium nodes) can be posts, posts made up of solid, posts made up of multiple layers of solids, post made up of polymer, post made up of metal, posts made up of organic, or posts made up of any two or more of the above-mentioned materials.

Then, in FIG. 10B, another semiconductor material layer 604 is formed on the semiconductor material layer 600 through, e.g., wafer bonding or fusion. The semiconductor material layer 600 and the semiconductor material layer 604 are formed of the same material. Also, the semiconductor material layer 600 and the semiconductor material layer 604 also can be formed of a dielectric substance (or multiple-layered film). The selection of materials depends on the actual requirements. The recesses 602 are used for forming the above-mentioned medium nodes 214 (or photonic crystal structures), and therefore, their positions are preset. Also, the shape of each recess 602 on the plane may be, for example, circle, ellipse, triangle, square, rectangle, ellipse, pentagon, or complex pattern, but is not limited to these shapes.

Figure 10C:
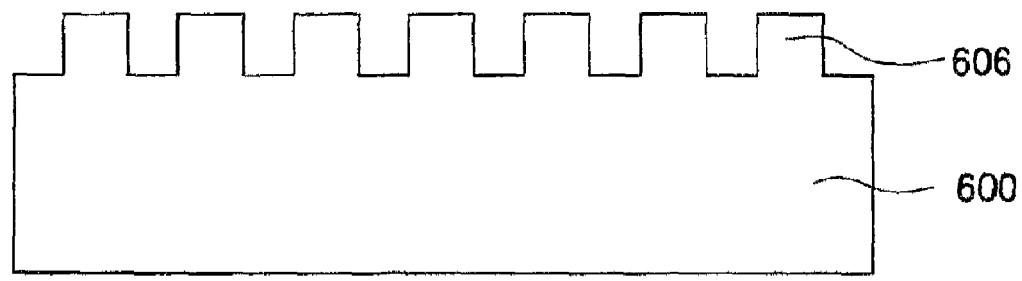
Figure 10D:
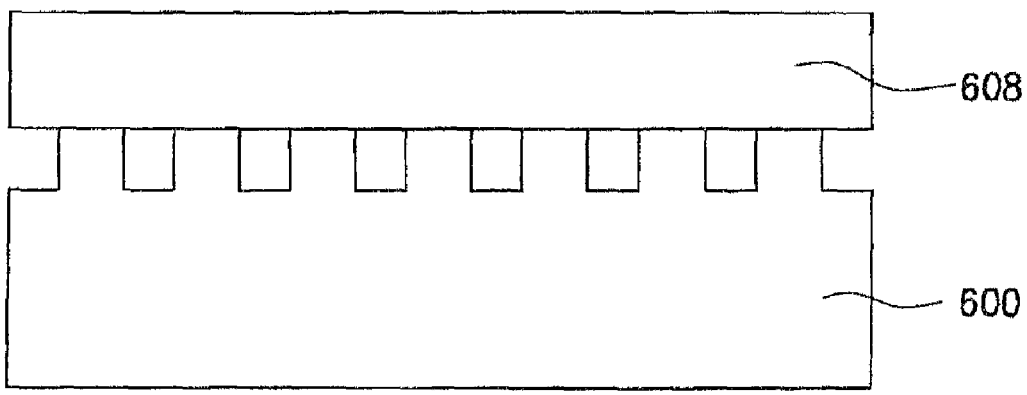

FIGS. 10C and 10D show EM wave polarizing structure made up of cylinder medium nodes. Cylinder medium nodes 606 can be formed on the semiconductor material layer 600. After another semiconductor material layer 608 deposited on the cylinder medium nodes 606, the cylinder medium nodes 214 form the array structure of said EM wave polarizing structure.

The EM wave polarizing structure depicted in the invention includes a layer of two-dimensional asymmetric medium node array, wherein two degenerate modes, e.g. TE and TM modes, can be separated or converted by using a set frequency, with the design that the medium nodes 214 are regularly distributed substantially asymmetrical with respect to said operation axis direction.

The operation frequency is usually selected close to a/λ, for example, as shown in FIGS. 6A and 6B, wherein "a" is the short unit axis lattice constant of, for example, an in-equilateral parallelogram photonic unit lattice cell, and λ is said EM wavelength.

With the above EM wave polarizing structure, the EM wave polarizing device depicted in the invention can generate polarized EM wave efficiently, and especially, it can be used on the light emitting device such as LED, OLED, PLED, or VCSEL to generate polarized light directly. Furthermore said EM wave polarizing structure can be further integrated into a light emitting device.

The materials used in a polarized EM wave emitting device can include a III-V group semiconductor material, an organic material, a polymer material, or any combinations of aforementioned materials. The III-V group semiconductor materials include a nitride based material, or an eptiaxial GaAs or InP based grown material. Moreover, the referred nitride base material includes a non-polar material or a semi-polar material.

It will be apparent to those skilled in the art that various modifications and variations can be made on the structure of the invention without departing from the scope or spirit of the invention. In view of the foregoing, it is intended that the invention cover modifications and variations of this invention provided they fall within the scope of the following claims and their equivalents.

What is claimed is:

1. An electromagnetic (EM) wave polarizing structure, comprising:
    a two dimensional planar pattern structure having medium nodes, wherein said medium nodes are regularly distributed as a plurality of planar photonic unit lattice cells being two-dimensional on a plane, each of said planar photonic unit lattice cells is identical and has an operation axis, of which direction passes a diagonal of said photonic unit lattice cell, and said medium nodes within each of said photonic unit lattice cells distributed asymmetrical with respect to said operation axis direction are identical at each lattice point, wherein each of said photonic unit lattice cells is an in-equilateral parallelogram, wherein said EM wave polarizing structure thus processes a non-in-plane EM wave at around an operation frequency associated with said EM wave polarizing structure and outputs a polarized EM wave.

2. The EM wave polarizing structure of claim 1, wherein said non-in-plane EM wave is non-polarized or partially polarized and said polarized EM wave is one of TE polarization and TM polarization.

3. The EM wave polarizing structure of claim 1, wherein said non-in-plane EM wave is polarized into said EM wave with one of TE polarization and TM polarization in accordance with said operation frequency.

4. An electromagnetic (EM) wave polarizing device, comprising:
    an EM polarizing structure according to claim 1, wherein said photonic unit cells have a photonic crystal band structure, in which said operation frequency is selected close to one of frequency bands of said photonic crystal band structure; and
    a non-in-plane EM wave emitting source structure associated with said EM polarizing structure emitting said non-in-plane EM wave at around said operation frequency,
    wherein said EM wave polarizing structure processes said non-in-plane EM wave and said device thus outputs said polarized EM wave.

5. The EM wave polarizing device of claim 4, wherein said polarized EM wave is one of TE mode polarization and TM mode polarization.

6. The EM wave polarizing device of claim 4, wherein said frequency bands at around said operation frequency are sufficiently separated, and each of said frequency bands has a corresponding polarization state.

7. The EM wave polarizing device of claim 4,
    wherein the non-in-plane EM wave emitting source structure is a visible light emitting device and is integrated with said EM polarizing structure, wherein said EM polarizing structure is part of said light emitting device.

8. The EM wave polarizing device of claim 4, wherein said medium nodes are holes or holes filled with a material, and the material is at least one selected from the group consisting of dielectric substance, organic substance, metal, solid substance, holes polymer, stacked layers of solids, and holes liquid.

9. The EM wave polarizing device of claim 4, wherein said medium nodes are posts or posts made up of a material, and said material is at least one selected from the group consisting of dielectric substance, organic substance, metal, solid, polymer, stacked layers of solids, and liquid.

10. The EM wave polarizing device of claim 4, wherein said medium node on said plane is in a shape, and said shape is one selected from the group consisting of circle, triangle, square, rectangle, ellipse, pentagon, and complex pattern.

11. The EM wave polarizing device of claim 4, wherein a refractive index of said medium node is different from that of a surrounding background medium.

12. The EM wave polarizing device of claim 4, wherein a center of each of said photonic unit lattice cells further comprises at least a central medium node.

13. The EM wave polarizing device of claim 4, wherein a depth of said medium node is greater than a quarter of one EM wavelength.

14. A method for providing polarized electromagnetic (EM) wave, comprising:

providing an EM polarizing structure, a two dimensional planar pattern structure having medium nodes, wherein said medium nodes are regularly distributed as a plurality of planar photonic unit lattice cells being two-dimensional on a plane, each of said planar photonic unit lattice cells is identical and has an operation axis, of which direction passes a diagonal of said photonic unit lattice cell, and said medium nodes within each of said photonic unit lattice cells distributed asymmetrical with respect to said operation axis direction are identical at each lattice point, and wherein each of said photonic unit lattice cells is an in-equilateral parallelogram; and using said EM wave polarizing structure to process a non-in-plane EM wave at around an operation frequency associated with said EM wave polarizing structure and outputs a polarized EM wave.

15. The method for providing polarized electromagnetic wave of claim 14, wherein in the step of providing said EM polarizing structure, said medium nodes are holes or holes filled with a material, and said material is at least one selected from the group consisting of dielectric substance, organic substance, metal, solid, polymer, stacked layers of solids, and liquid.

16. The method for providing polarized electromagnetic wave of claim 14, wherein in the step of providing said EM polarizing structure, wherein said medium nodes are posts or posts made up of a material, and said material is at least one selected from the group consisting of dielectric substance, organic substance, metal, solid, polymer, stacked layers of solids, and liquid.

17. The method for providing polarized electromagnetic wave of claim 14, wherein in the step of providing said EM polarizing structure, a refractive index of said medium node is different from that of a surrounding background medium.

* * * * *